US009905494B2

(12) United States Patent
Soyano

(10) Patent No.: US 9,905,494 B2
(45) Date of Patent: Feb. 27, 2018

(54) SEMICONDUCTOR DEVICE

(71) Applicant: FUJI ELECTRIC CO., LTD., Kawasaki-shi, Kanagawa (JP)

(72) Inventor: Shin Soyano, Shiojiri (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/472,675

(22) Filed: Mar. 29, 2017

(65) Prior Publication Data
US 2017/0213777 A1 Jul. 27, 2017

Related U.S. Application Data

(63) Continuation of application No. PCT/JP2016/054914, filed on Feb. 19, 2016.

(30) Foreign Application Priority Data

Apr. 27, 2015 (JP) .................. 2015-090099

(51) Int. Cl.
H01L 23/40 (2006.01)
H01L 23/367 (2006.01)
(Continued)

(52) U.S. Cl.
CPC .......... H01L 23/3675 (2013.01); H01L 23/15 (2013.01); H01L 23/3736 (2013.01); H01L 23/49827 (2013.01); H01L 23/49833 (2013.01); H01L 23/49838 (2013.01); H01L 23/49866 (2013.01); H01L 25/0655 (2013.01); H01L 23/42 (2013.01); H01L 33/647 (2013.01);
(Continued)

(58) Field of Classification Search
CPC ............ H01L 23/42; H01L 2023/4068; H01L 2023/4087; H01L 33/647
USPC ......................................... 257/717
See application file for complete search history.

(56) References Cited

U.S. PATENT DOCUMENTS

2002/0185718 A1* 12/2002 Mikubo ............... H01L 23/433
257/678
2003/0197260 A1* 10/2003 Nishimura ............ H01L 25/03
257/686
(Continued)

FOREIGN PATENT DOCUMENTS

EP    2790215 A1   10/2014
EP    2897165 A1    7/2015
(Continued)

Primary Examiner — George Fourson, III
(74) Attorney, Agent, or Firm — Rabin & Berdo, P.C.

(57) ABSTRACT

A semiconductor device includes a heat radiation cooling base, a first insulating substrate including first and second copper patterns disposed on lower and upper surfaces thereof, respectively, a semiconductor chip including a first main electrode and a control electrode disposed on a first principal surface, and a second main electrode disposed on a second principal surface thereof, and a second insulating substrate including third and fourth copper patterns disposed on lower and upper surfaces thereof, respectively. The second main electrode is bonded to the second copper pattern. The third copper pattern is bonded to at least one of the first main electrode and the control electrode of the semiconductor chip. The third copper pattern and the fourth copper pattern are electrically connected to each other.

13 Claims, 9 Drawing Sheets

(51) Int. Cl.
*H01L 23/498* (2006.01)
*H01L 23/373* (2006.01)
*H01L 23/15* (2006.01)
*H01L 25/065* (2006.01)
*H01L 33/64* (2010.01)
*H01L 23/42* (2006.01)

(52) U.S. Cl.
CPC ................. *H01L 2023/4068* (2013.01); *H01L 2023/4087* (2013.01)

(56) References Cited

U.S. PATENT DOCUMENTS

| | | | |
|---|---|---|---|
| 2006/0192253 A1 | 8/2006 | Okumura et al. | |
| 2007/0040186 A1 | 2/2007 | Fillion et al. | |
| 2007/0267740 A1* | 11/2007 | Khan | H01L 23/3128 257/712 |
| 2008/0054439 A1 | 3/2008 | Malhan et al. | |
| 2008/0230905 A1 | 9/2008 | Guth et al. | |
| 2011/0254177 A1 | 10/2011 | Malhan et al. | |
| 2012/0244697 A1 | 9/2012 | Okumura et al. | |
| 2013/0016477 A1* | 1/2013 | Yokoya | H01L 23/36 361/719 |
| 2013/0058067 A1* | 3/2013 | Yee | H01L 23/36 361/820 |
| 2013/0069215 A1 | 3/2013 | Nakao et al. | |
| 2013/0093082 A1 | 4/2013 | Okumura et al. | |
| 2013/0146339 A1 | 6/2013 | Yano et al. | |
| 2013/0221500 A1* | 8/2013 | Zhao | H01L 25/0657 257/660 |
| 2013/0308278 A1* | 11/2013 | Matsumoto | H05K 7/205 361/720 |
| 2014/0084445 A1* | 3/2014 | Lin | H01L 23/3677 257/698 |
| 2014/0252645 A1* | 9/2014 | Kim | H01L 23/34 257/774 |
| 2014/0346676 A1 | 11/2014 | Horio et al. | |
| 2015/0235923 A1 | 8/2015 | Yasuda | |
| 2015/0243640 A1 | 8/2015 | Horio et al. | |
| 2017/0047312 A1* | 2/2017 | Budd | G02B 6/4204 |

FOREIGN PATENT DOCUMENTS

| | | |
|---|---|---|
| JP | 2004-160549 A | 6/2004 |
| JP | 2006-237429 A | 9/2006 |
| JP | 2007-053379 A | 3/2007 |
| JP | 2008-060531 A | 3/2008 |
| JP | 2008-235898 A | 10/2008 |
| JP | 2009-064852 A | 3/2009 |
| JP | 2013-069782 A | 4/2013 |
| JP | 2014-056920 A | 3/2014 |
| WO | WO-2013/084334 A1 | 6/2013 |
| WO | WO-2013/118415 A1 | 8/2013 |

* cited by examiner

|  | MATERIAL NAME | THERMAL CONDUCTIVITY (W/m·K) | LINEAR EXPANSION COEFFICIENT ($\times 10^{-6}$/°C) |
|---|---|---|---|
| METAL | Al | 221.54 | 23.60 |
|  | Cu | 392.90 | 16.50 |
| CHIP | Si | 83.60 | 3.00 |
| CIRCUIT BOARD | $Si_3N_4$ | 80.00 | 3.40 |
| INSULATING SUBSTRATE | $Si_3N_4$ | 80.00 | 3.40 |

FIG. 4

SEMICONDUCTOR DEVICE

CROSS-REFERENCE TO RELATED APPLICATION

This application is a continuation application of International Application PCT/JP2016/054914 filed on Feb. 19, 2016 which designated the U.S., which claims priority to Japanese Patent Application No. 2015-090099, filed on Apr. 27, 2015, the entire contents of which are incorporated herein by reference.

BACKGROUND OF THE INVENTION

1. Field of the Invention

The embodiments discussed herein are related to a semiconductor device.

2. Background of the Related Art

In recent years semiconductor devices which also have resistance to a large-current and high-voltage operating environment have come into use in robots, machine tools, electric vehicles, and the like as power converters for driving a motor. Such semiconductor devices are mainly formed by the use of power semiconductor elements such as insulated gate bipolar transistors (IGBTs) and freewheeling diodes (FWDs).

Usually a semiconductor device has the following structure. A semiconductor chip is mounted over an insulating substrate. For example, the semiconductor chip and a circuit pattern of the insulating substrate or the semiconductor chip and internal terminals in a case are connected by the use of a conductive member (see, for example, International Publication Pamphlet No. WO2013/118415 (paragraph [0002], FIG. 16)). That is to say, circuit patterns are formed over both surfaces of the insulating substrate. A circuit pattern formed over one surface is bonded with solder to a heat radiation base. The semiconductor chip and lead-out terminals are bonded with solder to a circuit pattern formed over the other surface of the insulating substrate. Furthermore, for example, the semiconductor chip and the circuit pattern or the semiconductor chip and the internal terminals in the case are bonded together by the use of bonding wires.

Aluminum bonding wires, for example, are used as the bonding wires and are bonded to the semiconductor chip and the circuit pattern by ultrasonic welding or the like. The cross-sectional area of a bonding wire is small. Therefore, bonding wires whose number corresponds to a current capacity are connected in parallel in a wiring portion through which a principal current flows.

With a semiconductor device in which wiring is performed in this way by the use of bonding wires, heat generated by a semiconductor chip is transferred to a heat radiation base via an insulating substrate and is radiated from the heat radiation base to the outside. However, because there are demands for an increase in rated current and a decrease in chip size, semiconductor chips generate much heat at energization time. This causes a great rise in temperature. As a result, a bonding wire peels off a bonding area of a semiconductor chip or radiation of heat from a heat radiation base becomes insufficient.

On the other hand, there are semiconductor devices in which wiring is performed by the use of copper lead plates in place of bonding wires. Because the cross-sectional area of a copper lead plate is larger than that of a bonding wire, a copper lead plate is advantageous as a conductive connecting member used in a portion through which a large current flows. A lead plate is connected to a main electrode of a semiconductor chip with solder and is connected to a circuit pattern of an insulating substrate with solder or by welding.

With a semiconductor chip in which copper lead plates are used as a wiring material, the copper lead plates are soldered to electrodes of the semiconductor chip made of silicon (Si) or silicon carbide (SiC). The copper lead plates and the semiconductor chip differ in the linear expansion coefficient of a material. As a result, the reliability of solder at the interface between the copper lead plates and the semiconductor chip is deteriorated significantly by thermal stress created due to the difference in the linear expansion coefficient of a material between them. That is to say, if excessive distortion exceeding an allowable value is applied to the solder, a crack appears in the solder. The crack propagates by heat cycles. The propagation of the crack leads to an increase in the thermal resistance of the solder and a decrease in the heat radiation effect of the solder. This shortens the fatigue life of the solder. Accordingly, a case in which a semiconductor chip is held is sealed with gel to integrally fasten the internal structure with the gel. By doing so, the fatigue life of solder is lengthened. In this case, the semiconductor chip is sealed with the gel and the gel is hardened. As a result, heat generated by the semiconductor chip accumulates in the gel.

Therefore, a semiconductor device in which heat generated by a semiconductor chip is radiated not only from a heat radiation base but also from a side opposite to the heat radiation base is proposed (see, for example, Japanese Laid-open Patent Publication No. 2008-60531). This semiconductor device has the following structure. First and second non-planar insulating substrates each having a high thermal conductivity are electrically connected by posts. By doing so, a determined distance is kept between the first and second insulating substrates. A plurality of semiconductor chips and electronic parts are disposed between the first and second insulating substrates with solder stopper layers therebetween. As a result, heat generated by each semiconductor chip is radiated via the first and second insulating substrates disposed on both sides of it. Furthermore, main electrodes of each semiconductor chip are electrically connected via posts to circuit patterns formed over surfaces of the first and second insulating substrates opposite each other.

With the above semiconductor device (see, for example, International Publication Pamphlet No. WO2013/118415) bonding and wiring of a main electrode of the semiconductor chip are performed by the use of aluminum bonding wires. However, it is difficult to use a copper wire whose electrical resistivity is lower than that of an aluminum wire. That is to say, because copper is harder than aluminum, excess stress is applied at the time of bonding a copper wire, more particularly a thick copper wire to a semiconductor chip. As a result, the semiconductor chip may be destroyed.

Furthermore, the above semiconductor device (see, for example, Japanese Laid-open Patent Publication No. 2008-60531) is applicable only to a structure in which radiators can be disposed on both sides of a semiconductor chip. The solder stopper layers are used for bonding together the first and second non-planar insulating substrates having a high thermal conductivity and the semiconductor chips. This increases the height of the semiconductor device.

SUMMARY OF THE INVENTION

According to an aspect, there is provided a semiconductor device including a heat radiation cooling base, a first insulating substrate which has a first copper pattern and a second copper pattern formed over both surfaces and whose first copper pattern formed over one surface is bonded to the cooling base, a semiconductor chip which has a first main electrode and at least one control electrode over a first principal plane, which has a second main electrode over a second principal plane, and whose second main electrode is bonded to the second copper pattern of the first insulating substrate, and a second insulating substrate which has a third copper pattern and a fourth copper pattern formed over both surfaces and whose third copper pattern formed over one surface is bonded to at least the first main electrode of the first main electrode and at least the one control electrode of the semiconductor chip, the third copper pattern and the fourth copper pattern being electrically connected to each other.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 illustrates an example of the physical characteristics of an applied material;

DETAILED DESCRIPTION OF THE INVENTION

Embodiments will now be described in detail with reference to the accompanying drawings with a case where the technique in the present disclosure is applied to a power semiconductor module (semiconductor device) for driving a motor as an example. Two or more embodiments may be combined as long as there is no inconsistency.

First Embodiment

Figure 1:
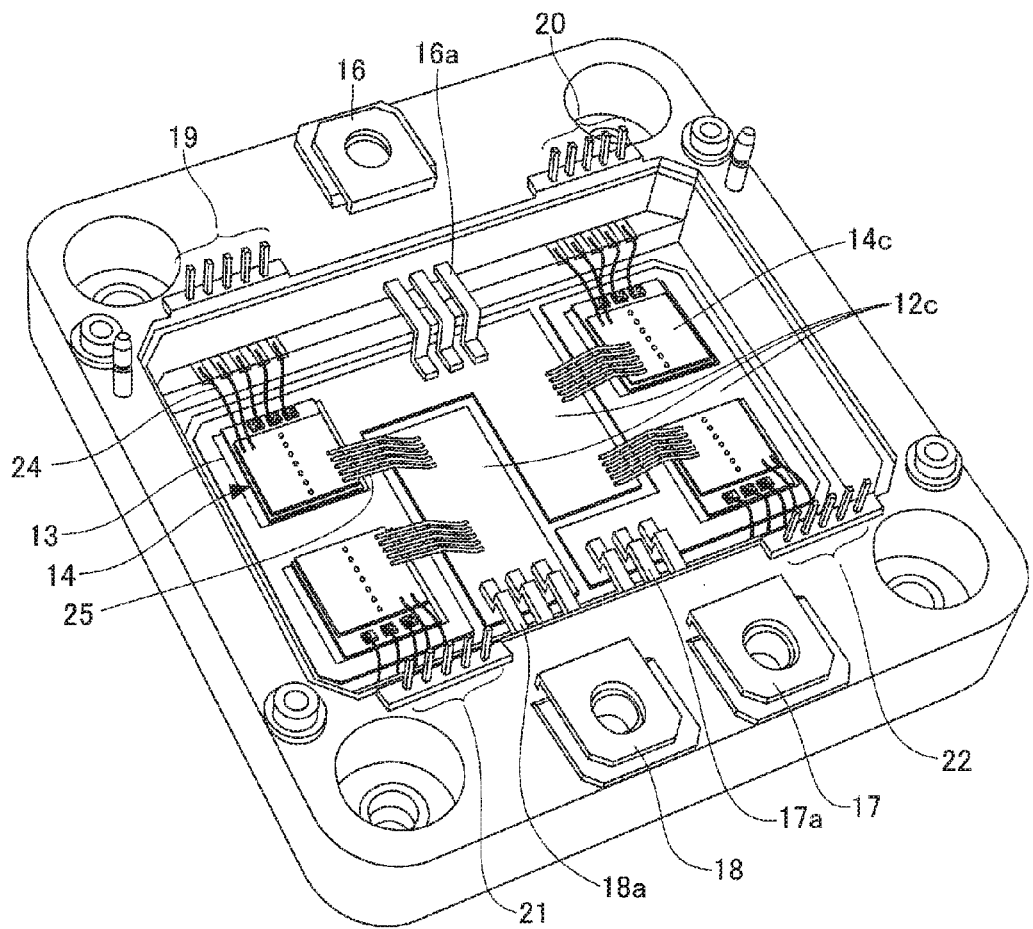
FIG. 1 is a perspective view illustrative of the internal structure of a semiconductor device according to a first embodiment.
Figure 2:
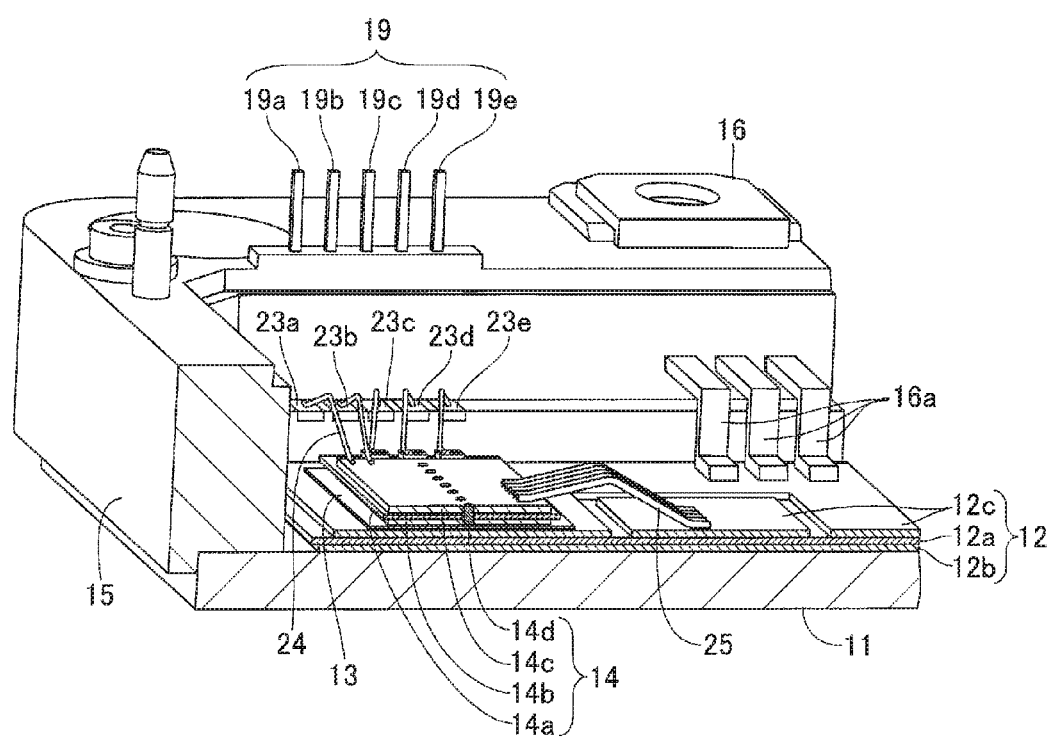
FIG. 2 is an enlarged fragmentary sectional view of the semiconductor device according to the first embodiment.
Figure 3A:
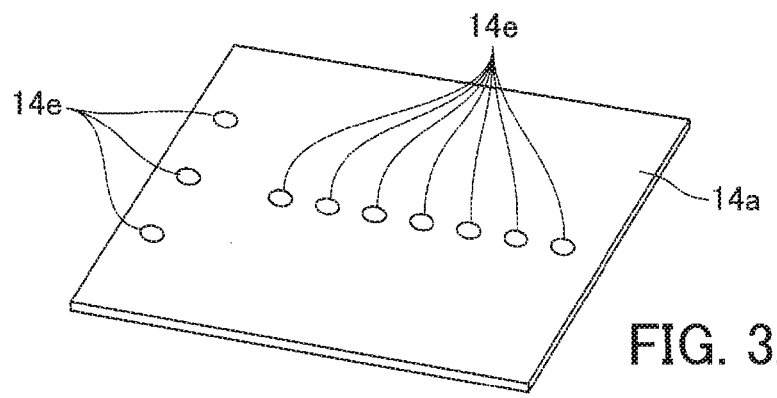
FIGS. 3A through 3C illustrate an example of a circuit board, FIG. 3A being a perspective view illustrative of a ceramic plate, FIG. 3B being a perspective view illustrative of one surface of a circuit board, and FIG. 3C being a perspective view illustrative of the other surface of the circuit board.
Figure 3B:
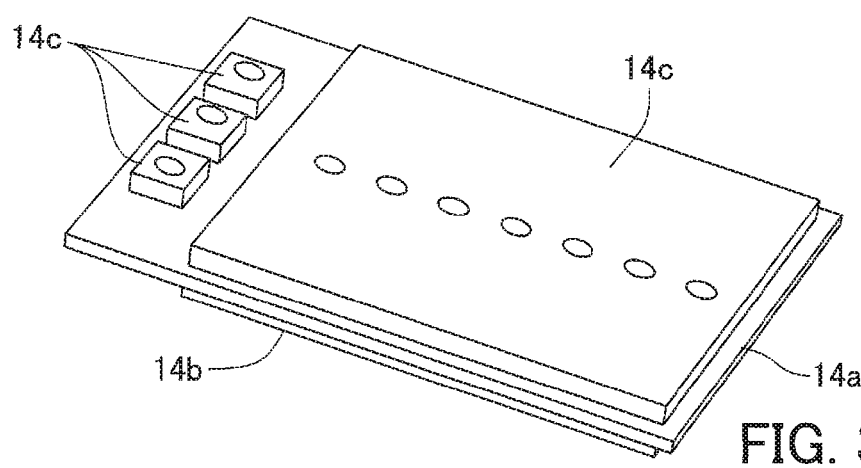
Figure 3C:
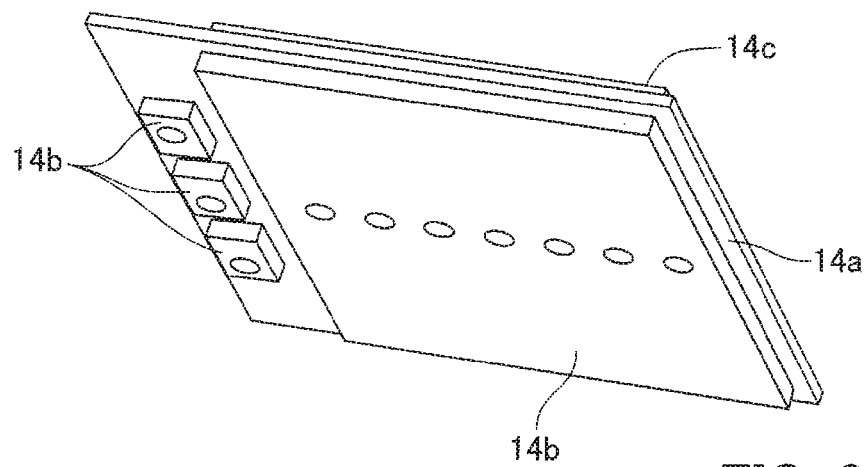

FIG. 1 is a perspective view illustrative of the internal structure of a semiconductor device according to a first embodiment. FIG. 2 is an enlarged fragmentary sectional view of the semiconductor device according to the first embodiment. FIGS. 3A through 3C illustrate an example of a circuit board. FIG. 3A is a perspective view illustrative of a ceramic plate. FIG. 3B is a perspective view illustrative of one surface of a circuit board. FIG. 3C is a perspective view illustrative of the other surface of the circuit board. FIG. 4 illustrates an example of the physical characteristics of an applied material.

As illustrated in FIG. 2, a semiconductor device according to a first embodiment includes a heat radiation cooling base 11 in its lower part. The cooling base 11 is a copper plate and a radiator (not illustrated) adheres to its lower surface. An insulating substrate (first insulating substrate) 12 is bonded to an upper surface of the cooling base 11. A copper foil (first copper pattern) 12b is formed over a back surface on the lower side of a ceramic plate 12a and a circuit pattern (second copper pattern) 12c is formed over a front surface on the upper side of the ceramic plate 12a. The insulating substrate 12 is formed in this way. The copper foil 12b formed over the back surface of the ceramic plate 12a is bonded to the cooling base 11 with solder.

A semiconductor chip 13 is mounted over the circuit pattern 12c formed over the front surface of the ceramic plate 12a. In the first embodiment, the semiconductor chip 13 is a reverse-conducting IGBT (RC-IGBT) formed by integrating an IGBT and a FWD into one chip. As illustrated in FIG. 1, four semiconductor chips 13 are disposed on peripheral portions of the rectangular insulating substrate 12. As a result, with this semiconductor device, for example, two semiconductor chips 13 connected in parallel and the two remaining semiconductor chips 13 connected in parallel are connected in series to form a half bridge circuit. A second main electrode (collector of the IGBT and a cathode of the FWD) formed over a lower surface, that is to say, over a second principal plane of the semiconductor chip 13 is bonded to the circuit pattern 12c of the insulating substrate 12 with solder.

A circuit board (second insulating substrate) 14 is bonded to an upper surface of the semiconductor chip 13 with solder. A circuit pattern (third copper pattern) 14b is formed over a back surface on the lower side of a ceramic plate 14a and a circuit pattern (fourth copper pattern) 14c is formed over a front surface on the upper side of the ceramic plate 14a. The circuit board 14 is formed in this way. Furthermore, the circuit pattern 14b and the circuit pattern 14c are electrically connected to each other by copper connecting members, such as pellets, 14d. The circuit pattern 14b formed over the back surface of the ceramic plate 14a is bonded with solder to a first main electrode and a control electrode (pad) formed over an upper surface, that is to say, over a first principal plane of the semiconductor chip 13. The first main electrode corresponds to an emitter of the IGBT and an anode of the FWD and the control electrode corresponds to a gate of the IGBT and an anode and a cathode of a temperature detection diode for overheat protection incorporated in the semiconductor chip 13.

The ceramic plate 14a is smaller in size than the semiconductor chip 13. As illustrated in FIG. 3A, plural penetration holes 14e are made in the ceramic plate 14a. The penetration holes 14e are made in a region where the first main electrode formed over the upper surface, that is to say, over the first principal plane of the semiconductor chip 13 is located and at positions corresponding to the control electrode formed over the first principal plane of the semiconductor chip 13. As illustrated in FIGS. 3B and 3C, the circuit pattern 14b and the circuit pattern 14c are stuck on both surfaces of the ceramic plate 14a and are connected to each other by the copper pellets 14d disposed in the penetration holes 14e. In the examples of FIGS. 2 and 3A through 3C, the pellets 14d are disposed so as to pierce the circuit pattern 14b, the ceramic plate 14a, and the circuit pattern 14c, and electrically connect the circuit pattern 14b and the circuit pattern 14c stuck on both surfaces of the ceramic plate 14a. However, the following method may be adopted. The pellets 14d are put in the penetration holes 14e of the ceramic plate 14a. A solder material is applied to both surfaces of the ceramic plate 14a. The circuit pattern 14b and the circuit pattern 14c are stuck on both surfaces of the ceramic plate 14a and heating is performed. By doing so, the circuit pattern 14b and the circuit pattern 14c are electrically connected.

In the first embodiment, the circuit board 14 is formed so as to perform a relay for the first main electrode and the control electrode of the semiconductor chip 13. This makes it easy to test the semiconductor chip 13 by the use of the circuit pattern 14c without making direct contact with the first main electrode or the control electrode of the semiconductor chip 13. The circuit board 14 may be bonded only to the first main electrode of the semiconductor chip 13. In this case, a bonding wire is connected directly to the exposed control electrode.

The cooling base 11 is also bonded with a frame-shaped resin case 15 insert-molded so as to have terminals in outer peripheral portions. There are main terminals 16, 17, and 18 of the semiconductor device in a frame portion of the resin case 15. By the way, in the first embodiment, the main terminal 16 corresponds to an output terminal of the half bridge circuit, the main terminal 17 corresponds to a positive electrode terminal of the half bridge circuit, and the main terminal 18 corresponds to a negative electrode terminal of the half bridge circuit. The main terminal 16 and three internal terminals 16a protruding toward the inside of the resin case 15 are integrally formed and are electrically connected. The main terminal 17 and three internal terminals 17a protruding toward the inside of the resin case 15 are integrally formed and are electrically connected. The main terminal 18 and three internal terminals 18a protruding toward the inside of the resin case 15 are integrally formed and are electrically connected. The internal terminals 16a, 17a, and 18a are connected to corresponding circuit patterns 12c of the insulating substrate 12.

Furthermore, there are control terminal groups 19, 20, 21, and 22 of the semiconductor device in the frame portion of the resin case 15. The control terminal groups 19, 20, 21, and 22 are formed according to the semiconductor chips 13. Each control terminal group includes five control terminals. Each control terminal group and an internal control terminal group extending to the inside of the resin case 15 are integrally formed and are electrically connected. As illustrated in FIG. 2, with the control terminal group 19, for example, control terminals 19a, 19b, 19c, 19d, and 19e are connected to internal control terminals 23a, 23b, 23c, 23d, and 23e respectively. The internal control terminals 23a, 23b, 23c, 23d, and 23e are connected to corresponding circuit patterns 14c of the circuit board 14 by bonding wires 24.

Furthermore, circuit patterns 14c of the circuit board 14 connected to the first main electrode of the semiconductor chip 13 are connected to corresponding circuit patterns 12c of the insulating substrate 12 by the use of bonding wires (conductive members) 25 by a welding method using heat, ultrasonic waves, pressure, or the like. The bonding wires 25 are bonded to the circuit board 14 and stress is not applied directly to the semiconductor chip 13 at bonding time. Therefore, thick wires made of copper can be used. The copper has a low electrical resistivity and large thermal conductivity, and the thick wires have large current capacity.

Finally, the resin case 15 is filled with gel and a central opening portion of the resin case 15 is covered with a lid. By doing so, the semiconductor device is completed. By sealing the semiconductor chips 13 and the wiring material in the resin case 15 with the gel, bonding portions in the resin case 15 are integrally fastened and the reliability of the bonding portions is improved.

As has been described, the first main electrode of the semiconductor chip 13 is bonded to the circuit pattern 14b of the circuit board 14 with solder. As indicated in FIG. 4, the linear expansion coefficient of the semiconductor chip 13 (silicon (Si)) is approximate to that of the ceramic plate 14a (silicon nitride ($Si_3N_4$)) of the circuit board 14. Therefore, thermal stress created due to the difference in linear expansion coefficient between them is small. As a result, the appearance of a crack in solder which bonds the semiconductor chip 13 and the circuit board 14 together is suppressed. Even if a crack appears, the rate of crack propagation caused by heat cycles is slow. Therefore, the fatigue life of the solder lengthens.

In addition, the circuit board 14 is connected to the circuit pattern 12c disposed in a central portion of the insulating substrate 12 by the thick copper bonding wires 25. That is to say, heat conducted to the front surface side of the semiconductor chip 13 is conducted via the circuit board 14 and the bonding wires 25 to the circuit pattern 12c disposed in the central portion of the insulating substrate 12 whose temperature is lower than that of the peripheral portion of the insulating substrate 12 over which the semiconductor chip 13 is placed. Accordingly, heat generated by the semiconductor chip 13 not only is conducted directly to the insulating substrate 12 but also is conducted to the insulating substrate 12 via the circuit board 14 and the bonding wires 25. As a result, the heat generated by the semiconductor chip 13 is efficiently conducted from the insulating substrate 12 to the cooling base 11. Moreover, copper bonding wires whose thermal conductivity is higher than that of aluminum bonding wires may be used as the bonding wires 25. Therefore, even if heat is conducted from the front surface side of the semiconductor chip 13 to the gel, the bonding wires 25 conduct heat which accumulates in the gel to the insulating substrate 12.

Furthermore, the bonding wires 25 are bonded to the circuit pattern 14c of the circuit board 14 at positions in a peripheral edge portion of the circuit pattern 14c distant from the center of the circuit pattern 14c and close to the center of the insulating substrate 12. As a result, in the circuit pattern 14c of the circuit board 14, a flow of heat is generated from the center whose temperature is highest to the peripheral bonding positions. Therefore, heat is uniformized in the circuit pattern 14c.

Second Embodiment

Figure 5:
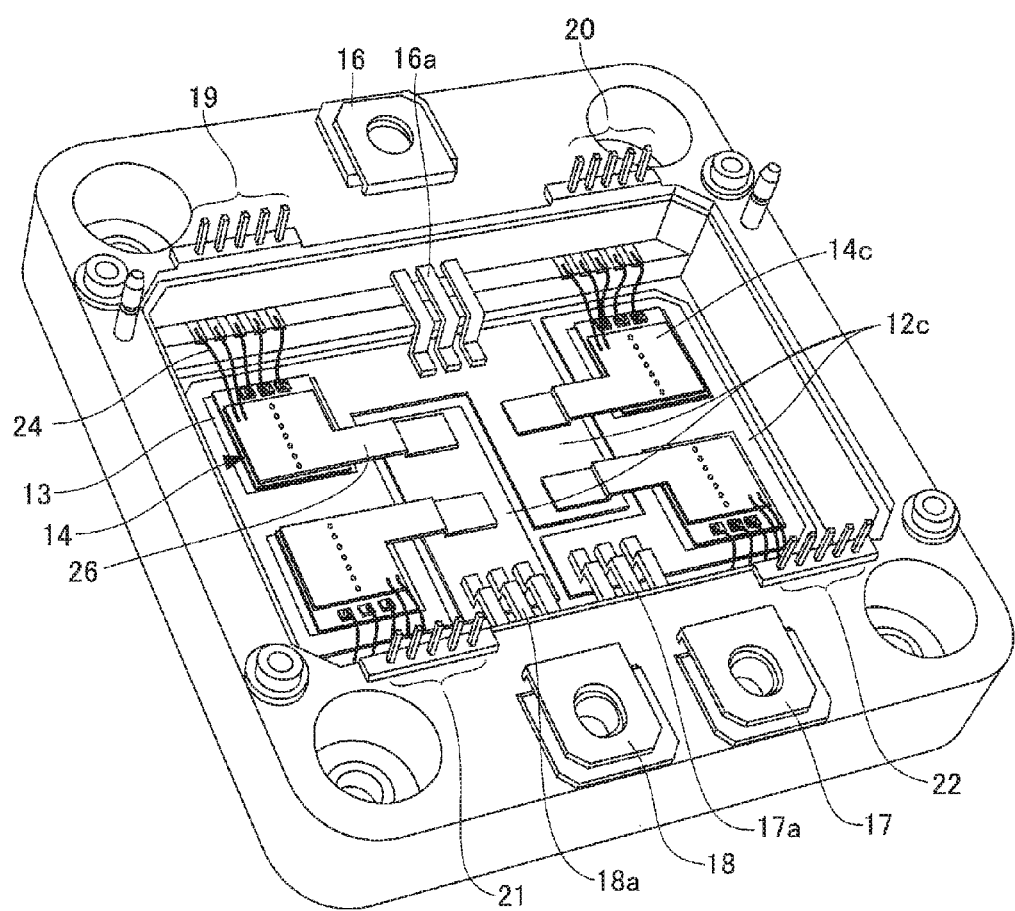
FIG. 5 is a perspective view illustrative of the internal structure of a semiconductor device according to a second embodiment.
Figure 6A:
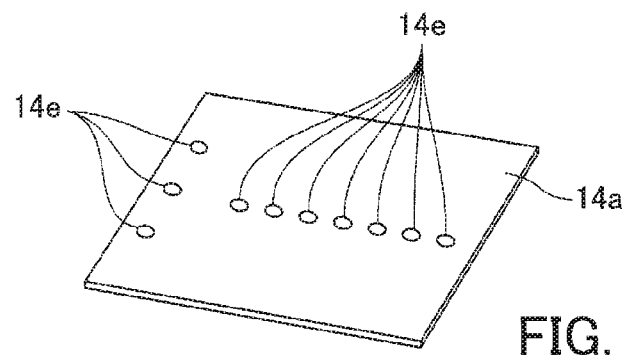
FIGS. 6A through 6C are enlarged fragmentary sectional views of the semiconductor device according to the second embodiment.
Figure 6B:
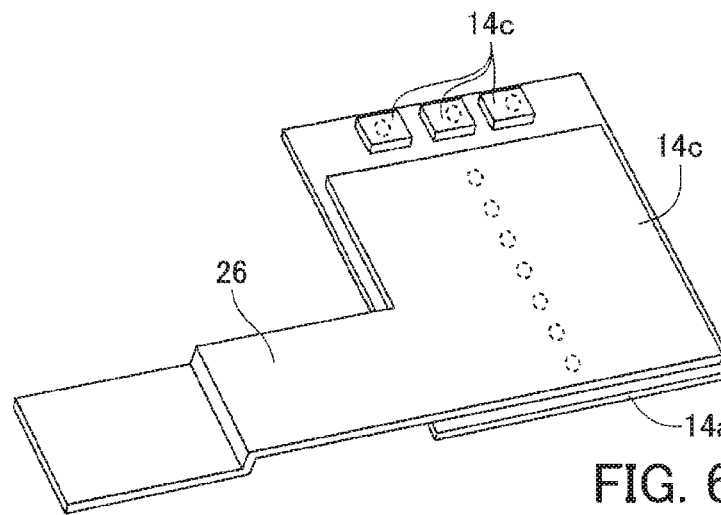
Figure 6C:
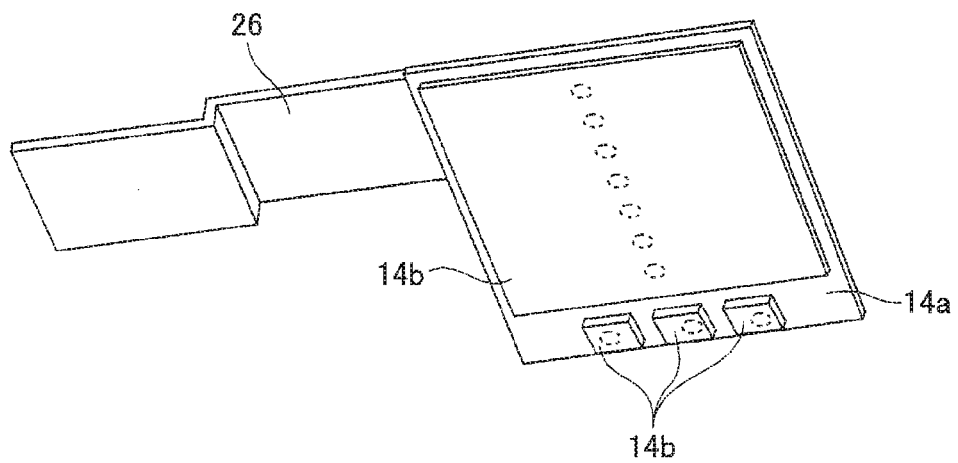

FIG. 5 is a perspective view illustrative of the internal structure of a semiconductor device according to a second embodiment. FIGS. 6A through 6C are enlarged fragmentary sectional views of the semiconductor device according to the second embodiment. Components in FIGS. 5 and 6A through 6C which are the same as or equivalent to those illustrated in FIGS. 1, 2, and 3A through 3C are marked with the same numerals and detailed descriptions of them will be omitted.

As illustrated in FIGS. 5 and 6A through 6C, a semiconductor device according to a second embodiment differs from the semiconductor device according to the first embodiment in that a circuit pattern 14c of a circuit board 14 and a circuit pattern 12c of an insulating substrate 12 are connected electrically and thermally by another means.

That is to say, the circuit pattern 14c of the circuit board 14 and a copper lead plate (conductive member) 26 are integrally formed and a free end of the lead plate 26 is bonded to the circuit pattern 12c of the insulating substrate 12 by soldering or welding (using laser, ultrasonic waves, or the like).

The circuit pattern 14c of the circuit board 14 and the circuit pattern 12c of the insulating substrate 12 are connected by the copper lead plate 26 having a large cross-sectional area. As a result, current capacity and sufficient heat conduction from the circuit pattern 14c to the circuit pattern 12c are ensured.

The circuit board 14 is formed in the following way. Pellets 14d are inserted into penetration holes 14e of a ceramic plate 14a and a solder material is applied to both surfaces of the ceramic plate 14a. A circuit pattern 14b and the circuit pattern 14c with the lead plate 26 are stuck on both surfaces of the ceramic plate 14a and heating is performed.

With the above structure a first main electrode of a semiconductor chip 13 is also bonded to the circuit pattern 14b of the circuit board 14 with solder. However, because the difference in linear expansion coefficient between the semiconductor chip 13 and the ceramic plate 14a of the circuit board 14 is small, the fatigue life of the solder lengthens. Furthermore, the lead plate 26 extends from a peripheral edge portion of the circuit pattern 14c. As a result, heat does not concentrate in the circuit pattern 14c and is uniformized. In addition, because the lead plate 26 has a large cross-sectional area, heat is efficiently transferred to the circuit pattern 12c of the insulating substrate 12.

Third Embodiment

Figure 7:
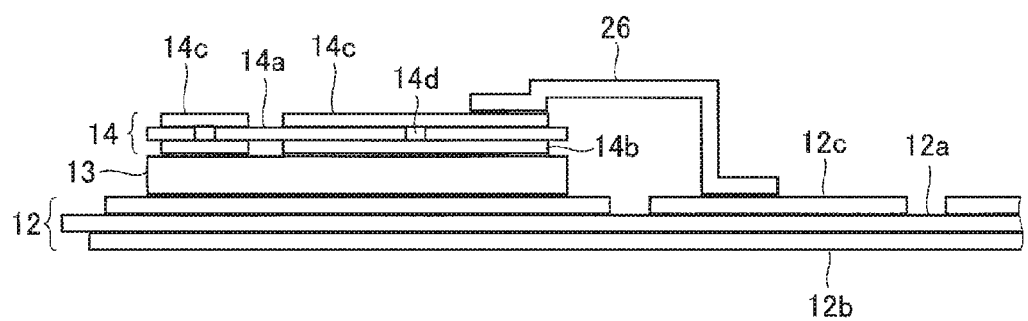
FIG. 7 is an enlarged fragmentary sectional view of a semiconductor device according to a third embodiment.

FIG. 7 is an enlarged fragmentary sectional view of a semiconductor device according to a third embodiment. Components in FIG. 7 which are the same as or equivalent to those illustrated in FIG. 2 are marked with the same numerals and detailed descriptions of them will be omitted.

As illustrated in FIG. 7, with a semiconductor device according to a third embodiment a circuit pattern 14c of a circuit board 14 and a circuit pattern 12c of an insulating substrate 12 are connected electrically and thermally by a copper lead plate (conductive member) 26.

That is to say, one end of the copper lead plate 26 is bonded to the circuit pattern 14c of the circuit board 14 by soldering or welding. The other end of the copper lead plate 26 is bonded to the circuit pattern 12c of the insulating substrate 12 by soldering or welding. At this time the one end of the copper lead plate 26 is bonded not to a central portion but to a peripheral edge portion of the circuit pattern 14c of the circuit board 14.

With the above structure a first main electrode of a semiconductor chip 13 is also bonded to a circuit pattern 14b of the circuit board 14 with solder. However, the fatigue life of the solder lengthens. Furthermore, the copper lead plate 26 is bonded to the peripheral edge portion of the circuit pattern 14c. As a result, heat does not concentrate in the circuit pattern 14c and is uniformized. In addition, because the copper lead plate 26 has a large cross-sectional area, heat is efficiently transferred from the circuit pattern 14c to the circuit pattern 12c of the insulating substrate 12.

Fourth Embodiment

Figure 8:
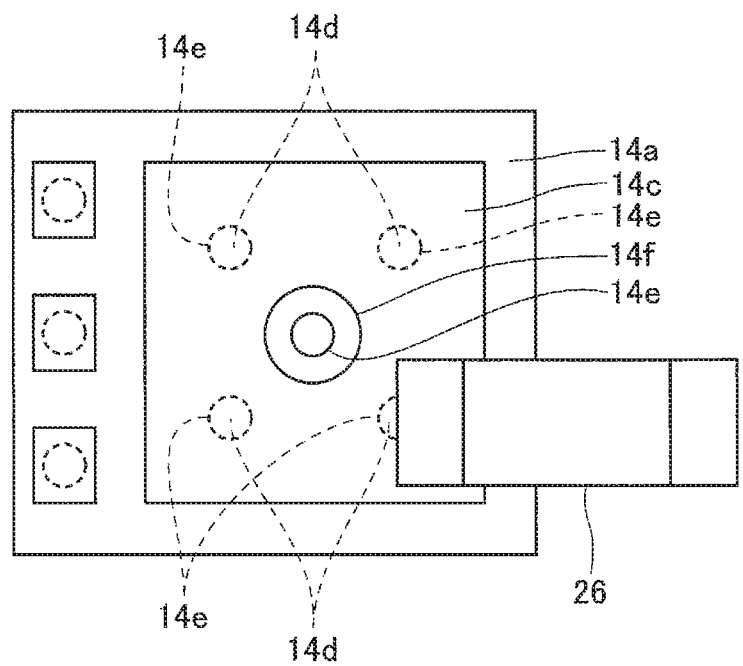
FIG. 8 is a plan view illustrative of a circuit board of a semiconductor device according to a fourth embodiment.

FIG. 8 is a plan view illustrative of a circuit board of a semiconductor device according to a fourth embodiment. Components in FIG. 8 which are the same as or equivalent to those illustrated in FIGS. 3A through 3C and 6A through 6C are marked with the same numerals and detailed descriptions of them will be omitted.

With a semiconductor device according to a fourth embodiment a penetration hole 14e made approximately in a central portion of a ceramic plate 14a of a circuit board 14 is not stuffed with a pellet 14d. That is to say, this penetration hole 14e remains empty. An opening portion 14f is formed in a circuit pattern 14c at a position corresponding to the empty penetration hole 14e. An opening portion may not be formed in a circuit pattern 14b on a semiconductor chip 13 side at a position corresponding to the empty penetration hole 14e.

As a result, when heat transferred from a semiconductor chip 13 to the circuit board 14 flows through the circuit pattern 14c on the upper surface of the circuit board 14 to a lead plate 26, it bypasses the central portion whose temperature is highest. Furthermore, a flow of heat is always generated in the direction of the outer periphery from the central portion whose temperature is highest. Because there is a flow of heat in the circuit pattern 14c, heat distribution is uniformized in the circuit board 14. That is to say, the temperature of the circuit board 14 does not locally become high.

(Modification of Circuit Board)

Figure 9A:
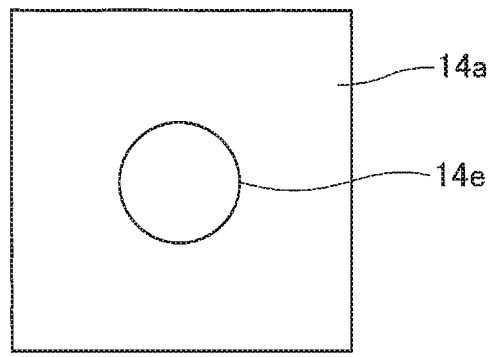
FIGS. 9A through 9C illustrate modifications of the ceramic plate included in the circuit board, FIG. 9A illustrating a first modification of the circuit board, FIG. 9B illustrating a second modification of the circuit board, and FIG. 9C illustrating a third modification of the circuit board.
Figure 9B:
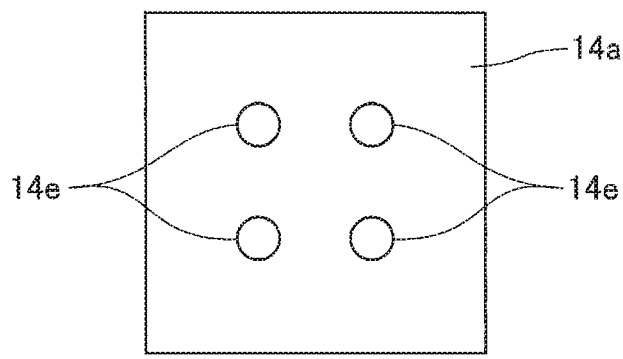
Figure 9C:
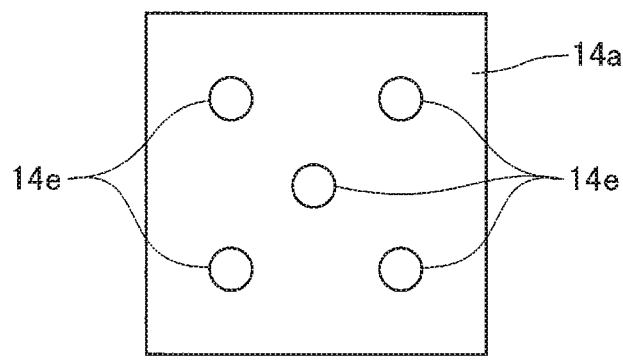

FIGS. 9A through 9C illustrate modifications of the ceramic plate included in the circuit board. FIG. 9A illustrates a first modification of the circuit board. FIG. 9B illustrates a second modification of the circuit board. FIG. 9C illustrates a third modification of the circuit board. Components in FIGS. 9A through 9C which are the same as or equivalent to those illustrated in FIG. 8 are marked with the same numerals. Furthermore, penetration holes for control terminals are not illustrated in FIGS. 9A through 9C.

The plural penetration holes 14e are disposed straight in the circuit board 14 used in the first and second embodiments. With a first modification of the circuit board 14 illustrated in FIG. 9A, however, a large penetration hole 14e is made in the middle of a ceramic plate 14a. In this case, the cross-sectional area of a pellet 14d disposed in the penetration hole 14e is large. Therefore, heat transfer from a circuit pattern 14b to a circuit pattern 14c is good. However, because there is a great difference in linear expansion coefficient between the ceramic plate 14a and the pellet 14d, the diameter of the penetration hole 14e is determined with the thermal conductivities and linear expansion coefficients of the ceramic plate 14a and the pellet 14d taken into consideration.

With a second modification of the circuit board 14 illustrated in FIG. 9B, four penetration holes 14e are made in a ceramic plate 14a. These penetration holes 14e are smaller in diameter than the penetration hole 14e in the first modification and are disposed dispersedly in the ceramic plate 14a. Accordingly, heat generated by a semiconductor chip 13 and a principal current of the semiconductor chip 13 flow dispersedly from a circuit pattern 14b through a pellet 14d to a circuit pattern 14c.

With a third modification of the circuit board 14 illustrated in FIG. 9C, five penetration holes 14e are made in a ceramic plate 14*a*. These penetration holes 14*e* are not heavily disposed in part of the ceramic plate 14*a* but disposed dispersedly and uniformly in the whole of the ceramic plate 14*a*. Accordingly, heat and a current from a semiconductor chip 13 uniformly pass through the whole of a circuit board 14. This eliminates concentration of heat or a current.

With the semiconductor devices having the above structures, the second insulating substrate functions as a relay terminal of the first main electrode of the semiconductor chip. Therefore, the semiconductor devices have the advantage of being able to bond hard and thick copper conductive members to the fourth copper pattern of the second insulating substrate without applying stress directly to the semiconductor chip.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a heat radiation cooling base;
   a first insulating substrate having upper and lower surfaces, and including
      a first copper pattern disposed on the lower surface, and being bonded to the cooling base, and
      a second copper pattern disposed on the upper surface;
   a semiconductor chip having first and second principal surfaces, and including
      a first main electrode and a control electrode disposed on the first principal surface, and
      a second main electrode disposed on the second principal surface, and being bonded to the second copper pattern of the first insulating substrate; and
   a second insulating substrate having upper and lower surfaces, and including
      a third copper pattern disposed on the lower surface, the third copper pattern being bonded to the first main electrode of the semiconductor chip, and
      a fourth copper pattern disposed on the upper surface, the third copper pattern and the fourth copper pattern being electrically connected to each other.

2. The semiconductor device according to claim 1, wherein the second insulating substrate has a penetration hole having copper therein, the third copper pattern and the fourth copper pattern being electrically connected by the copper disposed in the penetration hole.

3. The semiconductor device according to claim 1, wherein the first main electrode of the semiconductor chip is solder bonded to the third copper pattern of the second insulating substrate.

4. The semiconductor device according to claim 1, wherein:
   the second insulating substrate includes a plate comprised of ceramic having a first linear expansion coefficient;
   a difference between the first linear expansion coefficient and a second linear expansion coefficient of a material used for the semiconductor chip is smaller than a difference between a linear expansion coefficient of copper and the second linear expansion coefficient; and
   the plate has rear and front surfaces as the lower and upper surfaces, respectively, of the second insulating substrate.

5. The semiconductor device according to claim 1, wherein the first insulating substrate is disposed on the heat radiation cooling base, the semiconductor chip is disposed on the upper surface of the first insulating substrate, and the second insulating substrate is disposed on the first principal surface of the semiconductor chip.

6. The semiconductor device according to claim 1, wherein an area size of the first insulating substrate in plan view is greater than an area size of the second insulating substrate in plan view.

7. A semiconductor device, comprising:
   a heat radiation cooling base;
   a first insulating substrate having upper and lower surfaces, and including
      a first copper pattern disposed on the lower surface, and being bonded to the cooling base, and
      a second copper pattern disposed on the upper surface;
   a semiconductor chip having first and second principal surfaces, and including
      a first main electrode and a control electrode disposed on the first principal surface, and
      a second main electrode disposed on the second principal surface, and being bonded to the second copper pattern of the first insulating substrate; and
   a second insulating substrate having upper and lower surfaces, and including
      a third copper pattern disposed on the lower surface, the third copper pattern being bonded to the first main electrode of the semiconductor chip, and
      a fourth copper pattern disposed on the upper surface, the third copper pattern and the fourth copper pattern being electrically connected to each other, the upper and lower surfaces of the second insulating substrate having an area smaller than or equal to areas of the first and second principal surfaces of the semiconductor chip in size.

8. The semiconductor device according to claim 7, further comprising a conductive member comprised of a material having a thermal conductivity higher than a thermal conductivity of aluminum, and thermally and electrically bonding together an outer peripheral portion of the fourth copper pattern of the second insulating substrate and the second copper pattern of the first insulating substrate.

9. The semiconductor device according to claim 8, wherein the conductive member is a wire or a lead plate that is comprised of copper.

10. The semiconductor device according to claim 8, wherein
    the conductive member is a lead plate comprised of copper, and
    the lead plate and the fourth copper pattern of the second insulating substrate are integrally formed.

11. The semiconductor device according to claim 8, wherein
    the conductive member is a lead plate comprised of copper, and
    the lead plate is bonded to the second copper pattern of the first insulating substrate by soldering or welding.

12. The semiconductor device according to claim 8, wherein:
    the second copper pattern of the first insulating substrate has a first region and a second region respectively corresponding to a peripheral region and a central region of the first insulating substrate;

the semiconductor chip is mounted on the first region of the second copper pattern; and the conductive member has one end connected to the fourth copper pattern of the second insulating substrate and another end connected to the second region of the second copper pattern.

13. A semiconductor device, comprising:

a heat radiation cooling base;

a first insulating substrate having upper and lower surfaces, and including
- a first copper pattern disposed on the lower surface, and being bonded to the cooling base, and
- a second copper pattern disposed on the upper surface;

a semiconductor chip having first and second principal surfaces, and including
- a first main electrode and a control electrode disposed on the first principal surface, and
- a second main electrode disposed on the second principal surface, and being bonded to the second copper pattern of the first insulating substrate; and a second insulating substrate having upper and lower surfaces, and including
- a third copper pattern disposed on the lower surface, the third copper pattern being bonded to the first main electrode of the semiconductor chip, and
- a fourth copper pattern disposed on the upper surface, the third copper pattern and the fourth copper pattern being electrically connected to each other, the second insulating substrate and the fourth copper pattern having a penetration hole therethrough, the penetration hole being located at a position corresponding to a center of the semiconductor chip in plan view.

* * * * *